United States Patent [19]

Vogelsong

[11] Patent Number: 4,575,866

[45] Date of Patent: Mar. 11, 1986

[54] CHARGE TRANSFER FILTER STRUCTURE INCLUDING A SPLITTER AND EQUILIBRATOR

[75] Inventor: Thomas L. Vogelsong, Schenectady, N.Y.

[73] Assignee: General Electric Company, Schenectady, N.Y.

[21] Appl. No.: 510,523

[22] Filed: Jul. 5, 1983

[51] Int. Cl.[4] .................... G11C 19/28; H01L 29/78; H03H 15/02
[52] U.S. Cl. ...................................... 377/62; 357/24; 333/165
[58] Field of Search ................ 357/24; 377/57–63; 333/165

[56] References Cited

U.S. PATENT DOCUMENTS

| | | | |
|---|---|---|---|
| 3,925,805 | 12/1975 | Erb | 357/24 |
| 4,280,191 | 7/1981 | Rockett | 357/24 |
| 4,284,907 | 8/1981 | Vogelsong et al. | 307/221 |
| 4,383,187 | 5/1983 | Vogelsong et al. | 357/24 |

Primary Examiner—Gene M. Munson
Attorney, Agent, or Firm—Lawrence D. Cutter; James C. Davis, Jr.; Marvin Snyder

[57] ABSTRACT

A charge transfer filter utilizing a charge transfer accumulator structure for exponential smoothing of sampled data signals is described. The charge transfer accumulator structure performs charge equilibration at high speed thereby enabling an exponential decay impulse response to be obtained at high speed.

9 Claims, 7 Drawing Figures

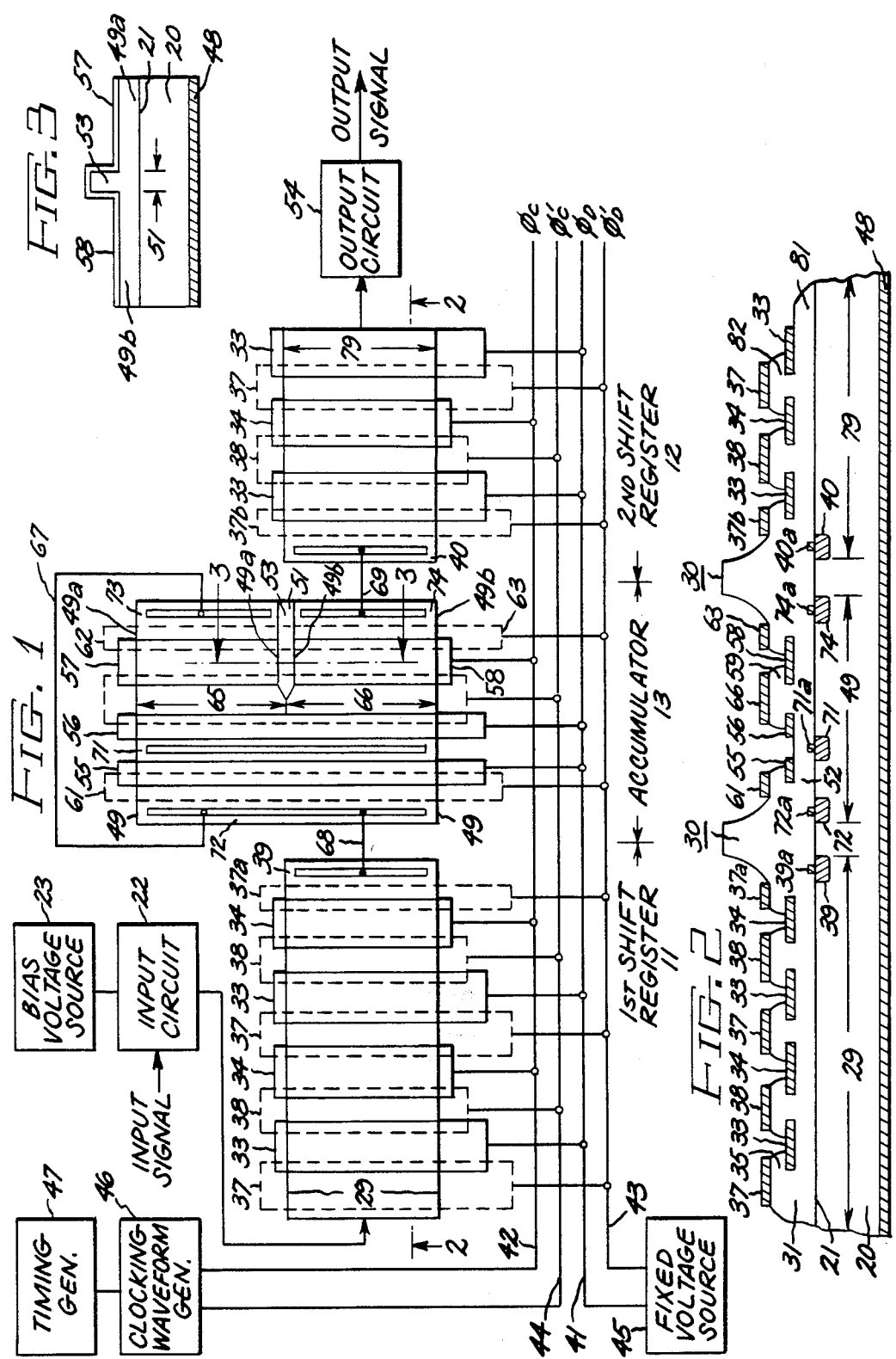

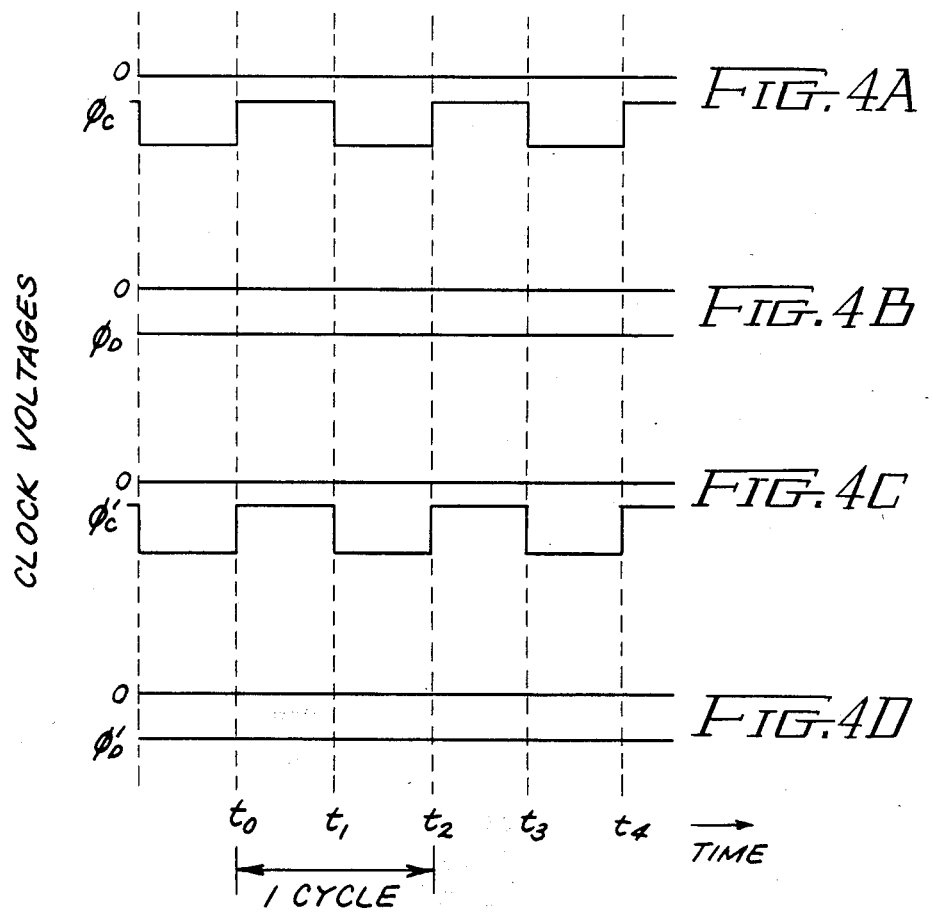

CHARGE TRANSFER FILTER STRUCTURE INCLUDING A SPLITTER AND EQUILIBRATOR

The present invention relates, in general, to charge transfer devices and more particularly to charge transfer structures for providing exponential smoothing of sample data signals.

The present invention relates particularly to filter structures of the type described in U.S. Pat. Nos. 4,124,862, Engeler et al., 4,124,861, Engeler et al. and U.S. Pat. No. 4,172,983 McLennon all of which are of common assignee herewith.

The present invention is an improvement over filter structure described in U.S. Pat. No. 4,284,907, Vogelsong et al. assigned to the assignee of the present invention.

This application is related to patent application Ser. No. 510,522 filed July 5, 1983 filed concurrently herewith and assigned to the assignee of the present invention.

A charge transfer filter device is described in U.S. Pat. No. 4,383,187 which includes a circulating shift register for implementing a pair of complex poles in the z-plane which corresponds to a sampled decaying sine wave in the time domain. Another charge transfer filter device is described in U.S. Pat. No. 4,284,907 which utilizes a recursive accumulator to implement a real axis pole in the z-plane which corresponds to a sampled decaying exponential in the time domain. The structures described in these patents all require some surface equilibration and ratioing of capacitances to perform charge splitting. Equilibration, i.e. the equilization of the potential of a quantity of charge, is slow for the last increment of charge to equilibrate resulting in a limit on the speed of operation of such devices. Also, equilibration of charge is an equilibrium phenomenon and consequently all capacitances involved in the storage of charge must be precisely ratioed and in addition all threshold voltages must be uniform to avoid inaccuracies in the splitting coefficients.

The present invention is directed to the provision of structures utilizing dynamic barrier splitting independent of capacitance ratios thereby providing high speed and high accuracy charge domain devices.

An object of the present invention is to provide improvements in charge transfer filters of the aforementioned type.

Another object of the present invention is to provide a charge transfer filter of the aforementioned type capable of operation at higher speeds than heretofore possible.

A further object of the present invention is to provide a charge transfer filter structure of the aforementioned type which is relatively simple in structure and organization.

In carrying out the invention in one illustrated embodiment thereof there is provided a substrate of semiconductor material of one conductivity type. Means are provided for forming an elongated first charge storage region in the substrate including a first storage electrode of generally elongated outline insulatingly overlying the first storage region. Means are provided for forming a pair of elongated second charge storage regions in the substrate including a pair of second storage electrodes of generally elongated outline, each insulatingly overlying a respective one of the second storage regions, a long side of one of the second storage regions being spaced a short distance from and parallel to a part of a long side of the first storage region. An elongated first region of opposite conductivity type and high conductivity is provided in the substrate having a long side contiguous with the other long side of the first storage region. Means are provided forming a pair of elongated first transfer regions in the substrate including a pair of first transfer electrodes each overlying a respective one of the first transfer regions, one of the first transfer regions in the substrate having a long side contiguous with the other long side of the first region of opposite conductivity type, the other of the first transfer regions in the substrate having a long side contiguous with the other long side of the second storage region. An elongated second region of opposite conductivity type and high conductivity is provided in the substrate having a long side contiguous with the other long side of the one first transfer region. An elongated third region of opposite conductivity type and high conductivity is provided in the substrate having a long side contiguous with the other long side of the other first transfer region. Means are provided for conductively interconnecting the second region of opposite conductivity type and the third region of opposite conductivity type. The second region of opposite conductivity type, the one of the first transfer regions, the first region of opposite conductivity type, and the first storage region each have long sides of a width equal to a first predetermined value. Means are provided for forming a pair of elongated second transfer regions including a pair of second transfer electrodes, one of the second transfer electrodes insulatingly overlying one of the second transfer regions, the other of the second transfer electrodes insulatingly overlying the other of the second transfer regions. One long side of the one second transfer region and one long side of said other second transfer region are coplanar and contiguous. The other long sides of the second transfer regions are noncontiguous. The other long side of the one second transfer region is contiguous to the one long side of the one second storage region. The other long side of the other second transfer region is contiguous to the one long side of said other second storage region. The sum of the width of the one long side of the one second transfer region and the width of the one long side of the other second transfer region are equal to the aforementioned first predetermined value.

Means are provided for applying a first fixed voltage to the first storage electrode to form the first storage region in said substrate. Means are provided for applying a first pulsating voltage to the second storage electrodes to form the pair of second storage regions in said substrate and to effect the transfer of charge between the first and second storage regions. Means are provided for applying a second fixed voltage to the first transfer electrodes. Means are provided for applying a second pulsating voltage to the pair of second transfer electrodes. Means are provided for synchronizing the first and second pulsating voltages. The second fixed voltage is of a value in relation to the first fixed voltage and the levels of the second pulsating voltage to permit transfer of charge in one direction from the first storage region to the second storage regions, and the levels of the second pulsating voltage are set in relation to the levels of the first pulsating voltage to permit transfer of charge in the one direction from the first storage region to the second storage regions under the control of the level of the potential on the pair of second transfer electrodes.

A sequence of first quantities of charge are provided, each quantity corresponding to a respective value of a series of successive values of a signal. Introducing means are provided including the second region of opposite conductivity typ for introducing serially each of the quantities of charge of the sequence into the first charge storage region, whereby over a first half of a cycle of the first pulsating voltage a first fixed portion of charge is transferred to the one second storage region and a second fixed fraction of charge is transferred to the other second storage region, and over a second half of a cycle of the first pulsating voltage the first fixed fraction of charge is transferred to the first charge storage region and combines with a successive quantity of charge introduced into the first charge storage region by the introducing means. Removing means are provided including the other of the second transfer regions for removing periodically the second fixed fraction of charge in the other second charge storage region to provide a sequence of second quantities of charge, the second fixed fraction of charge periodically removed from the second charge storage region by the removal means being determined by the ratio of the width of the one long side of the other second transfer region to the sum of the width of the one long side of the one second transfer region and the width of the one long side of the other second transfer region.

The novel features which are believed to be characteristic of the present invention are set forth with particularity in the appended claims. The invention itself, both as to its organization and method of operation, together with further objects and advantage thereof may best be understood by reference to the following description taken in connection with the accompaning drawings wherein:

FIG. 1 shows a plan view of one embodiment of the charge transfer filter structure in accordance with the present invention.

FIG. 2 shows a sectional view of the apparatus of FIG. 1 taken along section lines 2—2 of FIG. 1.

FIG. 3 shows a sectional view of the apparatus of FIG. 1 taken along section lines 3—3 of FIG. 1.

FIGS. 4A-4E show diagrams of voltage waveforms useful in explaining the operation of the apparatus of the present invention.

Reference is now made to FIGS. 1-3 which show apparatus 10 in accordance with the present invention. The apparatus 10 is formed on a substrate 20 of N-type conductivity having a major surface 21 and comprises a first charge transfer shift register 11, a second charge transfer shift register 12, and an accumulator stage 13. Typically, the substrate 20 may be silicon semiconductor material of suitable resistivity, for example, 4 ohm centimeters. The shift register 11 is formed over a channel portion 29 of the substrate 20. Overlying the major surface 21 of the substrate is a thick insulating member 30 of silicon dioxide having a thin portion 31, for example 1000 Angstroms thick, lying in registry with the channel portion 29. A plurality of first storage electrodes 33 of generally rectangular outline is provided on insulating member 30 overlying the thin portion 31. Each of the first electrodes is of uniform length in the direction of the length dimension of the channel portion 29, that is, in the direction of charge transfer. The length of each of the electrodes is also substantially smaller than the width dimension thereof. Each of the electrodes 33 have portions which extend over the insulating portions of the insulating member 30 bordering the thin insulating portion 31. A plurality of second storage electrodes 34 is provided on the insulating member overlying the thin portion 31 thereof. Each of the electrodes is of uniform length in the direction of the length dimension of the channel portion 29 and equal to the uniform length of the first electrodes 33. Each of the electrodes 33 may have portions which extend over the thick insulating portions of the insulating member 30 bordering the thin insulating portion. Another thin layer 35 of insulation, for example 1000 Angstroms thick, is provided over the electrodes 33 and 34. A plurality of first transfer electrodes 37 is provided over the insulating layer 35. Each of the transfer electrodes 37 is insulatingly spaced between a respective second electrode 34 and an adjacent succeeding first electrode 33 and overlying these electrodes, except in the last stage. The first transfer electrode 37a of the last stage is spaced between the second electrode 34 of the stage and a region 39 of opposite conductivity type in the substrate. One edge of the first transfer electrode 37a insulatingly overlies the second electrode 34. The other edge of the first transfer electrode 37a insulatingly overlies an adjacent long side of the region 39 of opposite conductivity type. The conductivity of the region 39 of opposite conductivity type is enhanced by an elongated metal strip 39a bonded to it. A plurality of second transfer electrodes 38 is provided over the insulating layer 35. Each of the second transfer electrodes 38 is insulatingly spaced between a respective first electrode 33 and an adjacent succeeding second electrode 34 and overlying these electrodes. Each of the transfer electrodes 37 and 38 is of substantially uniform extent in the direction of the length of the channel portion 29 and extends over a thin insulating portion of the insulating member 30 as well as bordering thick insulating portions thereof. The first and second transfer electrodes are shown in dotted outline to illustrate with clarity the structure and organization of the apparatus.

All of the first electrodes 33 of the shift register 11 are connected to a line 41 to which a $\phi_D$ voltage is supplied from a fixed voltage source 45. All of the second electrodes 34 of the shift register 11 are connected to line 42 to which a $\phi_C$ voltage is supplied from a clocking waveform generator 46. The clocking waveform generator 46 is under the control of the timing generator 47. All of the first transfer electrodes 37 of the shift register 11 are connected to a line 43 to which a $\phi_{D'}$ voltage is supplied from a fixed voltage source 45. All of the transfer electrodes 38 of the shift register 11 are connected to a line 44 to which a $\phi_C$ voltage is applied from a clocking waveform genertor 46. The $\phi_C$, $\phi_D$, $\phi'_C$ $\phi'_D$ voltage waveforms are shown in FIGS. 4A-4D, respectively. A conductive layer 56 of a suitable material such as gold is utectically bonded to the lower surface of the substrate to provide a substrate contact to which the ground line of the $\phi_D$, $\phi_D$, $\phi_C$ and $\phi'_C$ voltage sources are connected. Each set of four electrodes 38, 34, 37 and 33 serially arranged on a respective thin portion 31 of the insulating member and overlying a respective part of channel 29 form a stage of shift register 11.

Each stage of the shift register 11 includes a $\phi_D$ or first storage region underlying a $\phi_D$ or first electrode 33 and $\phi_C$ or second storage region underlying a $\phi_C$ or second electrode 34. The $\phi_D$ voltage applied to the $\phi_D$ electrode is fixed and produces a surface potential in the substrate underlying $\phi_D$ electrode which is fixed. The $\phi_C$ voltage applied to the $\phi_C$ electrode cycles between a high level and a low level above and below the $\phi_D$ voltage and produces a surface potential in the substrate underlying the $\phi_C$ electrode which cycles between a level above and below the fixed level underlying a $\phi_D$ electrode. When the $\phi_C$ voltage is at its high level, charge transfer is enabled from the $\phi_C$ storage region to the storage region, and conversely, when the $\phi_C$ voltage is at its low level, charge transfer from the $\phi_D$ storage region to the $\phi_C$ storage region is enabled. Each stage also includes a $\phi_D'$ or first transfer electrode 37 to which is applied a $\phi_D'$ or first transfer voltage of fixed value which produces a surface potential in the substrate underlying the electrode which is smaller in absolute magnitude than the surface potential underlying a $\phi_D$ electrode. Each stage also incudes a $\phi_C'$ or second transfer electrode 38 to which is applied $\phi_C'$ or second voltage having two levels. At the upper level a surface potential is produced in the substrate underlying the electrode which inhibits the transfer of charge from a $\phi_D$ storage region to a $\phi_C$ storage region. At the lower level a surface potential is produced enabling the transfer of charge from a $\phi_D$ storage region to a $\phi_C$ storage region. Thus, when the $\phi_C$ voltage is at its high level, charge is transferred from a $\phi_C$ storage cell to a $\phi_D$ storage cell and when both the $\phi_C$ voltage and the $\phi_C'$ voltage are at their low levels, charge is transferred from a $\phi_D$ storage cell to a $\phi_C$ storage cell. For each cycle of clocking voltages, $\phi_C$ and $\phi_C'$, from a $\phi_C$ storage cell to a $\phi_D$ storage cell and then to the next succeeding $\phi_C$ storage cell.

Packets of charge for insertion into the shift register 11 are generated by an input circuit 22 in response to an analog input signal. Input circuits such as input circuit 22 are well known in the art, one of which is described in connection with FIGS. 8A, 8B and 8C in U.S. Pat. No. 4,032,867 assigned to the assignee of the present invention and incorporated herein by reference thereto. This particular circuit is referred to as a fill and spill circuit. Of course, other input circuits may be utilized. A bias voltage source 23 connected to the input circuit 22 provides a fixed bias charge component to each packet of charge developed by the input circuit 22 which facilitates the transfer thereof. The output of the input circuit 22 is applied to the input stage of the first shift register 11.

The accumulator 13 is formed over a channel portion 49 of the substrate 20. The channel portion 49 includes branch portions 49a and 49b which are separated by divider portion 51. A thin layer 52, for example 1000 Angstroms thick, of silicon dioxide is provided over the channel region lying in registry with the channel portion 49 including the branch portions 49a and 49b. A thick block of silicon dioxide 53 is provided over the divider portion 51. A pair of first electrodes 55 and 56 of generally rectangular outline are provided overlying the thin layer 52 of silicon dioxide. Each of the first electrodes 55 and 56 is of uniform length in the direction of the length dimension of the channel portion 49, that is, in the direction of charge transfer. The length of each of the electrodes is also substantially smaller than the width thereof. Each of the first electrodes 55 and 56 have portions which extend over the thick portions of the insulating members 30 bordering the thin portion 52. A pair of second electrodes 57 and 58 are provided on the insulating member 30 overlying the thin portion 52. Each of the electrodes is of uniform length in the direction of the length dimension of the channel portion 52. The electrodes 57 and 58 are formed by a single conductive member having portions which extends over the thick insulating portions of the insulating member 30 bordering the thin insulating portion 52 and also extending over the block portion 53. Another thin layer 59 of insulation, for example 1000 Angstroms thick, is provided over the electrodes 55, 56, 57 and 58. A first transfer electrode 61 is provided over the insulating layer 59 partially overlying first storage electrode 55. A second first transfer electrode 62 is provided over the insulating layer 59 partially overlying the second charge storage electrode 57. Also, a third first transfer electrode 63 is provided over the insulating layer 59 partially overlying the second charge storage electrode 58. A second transfer electrode 65 and a second transfer electrode 66 is provided overlying the insulating layer 59. The electrodes 65 and 66 are formed by a single conductor having portions which extend over the thick insulating portions of the insulating member 30 bordering the thin insulating portion 59 and also extending over the thick insulating portion 53. The thick insulating portion 53 terminates in an edge lying under this conductive member dividing the conductive member into conductors 65 and 66. A first region 71 of opposite conductivity type is formed in the substrate having a long side underlying a long edge of first storage conductor 55 and having the other long edge thereof underlying an adjacent long edge of the first storage electrode 56. The elongated high conductivity region 71 of opposite conductivity type provides improved lateral conductivity in the storage region formed under the electrodes 55 and 56 as majority carrier conduction therein is inherently much faster than minority carrier equilibration in the storage region. The conductivity of the elongated regon 71 is enhanced by an elongated metal strip 71a bonded thereto.

A second region 72 of opposite conductivity type is formed in the substrate having one long side underlying an adjacent edge of the first transfer electrode 61. The conductivity of the elongated region 72 is enhanced by the elongated metal strip 72a bonded to it. A third region 73 of opposite conductivity type is formed in the substrate having a long side underlying an adjacent edge of the first transfer electrode 62. The conductivity of the elongated region 73 is enhanced by elongated metal strip 73a and bonded to it. A fourth region 74 of opposite conductivity type is provided in the substrate having a long side underlying an adjacent edge of the first transfer electrode 63. The conductivity of the elongated region 74 is enhanced by elongated metal strip 74a bonded to it. The third region of opposite conductivity type 73 is conductively connected over conductive line 67 to the second region 72 of opposite conductivity type. The second region 72 of opposite conductivity type is connected over conductive line 68 to region 39 of opposite conductivity type of the first shift register. The first storage electrodes 55 and 56 are connected to line 41 on which a $\phi_D$ voltage is supplied. The second storage electrodes 57 and 58 are connected to line 42 on which a $\phi_C$ voltage is supplied. All of the first transfer electrodes 61, 62 and 63 are connected to a line 43 to which a $\phi_D'$ voltage is supplied from fixed voltage source 45. All of the second transfer electrodes 65 and 66 are connected to a line 44 to which $\phi_C'$ voltage is applied from clocking waveform generator 46.

The second shift register 12 is formed on a channel portion 79 of the substrate 20. A thin portion 81 of insulation is provided in the thick insulating member 30 lying in registry with the channel portion 79. A plurality of first electrodes 33 of generally rectangular outline is provided on the insulating member 30 overlying the thin portions 81. Each of the first electrodes 33 is of uniform length in the direction of the length dimension of the channel portion 79, that is, in the direction of charge transfer. The length of each of the first electrodes 33 is also substantially smaller than the width dimensions thereof. Each of the first electrodes 33 have portions which extend over the thick insulating portions of insulating member 30 bordering the thin insulating portion 81. A plurality of second electrodes 34 is provided on the insualting member 30 overlying the thin portion 81. Each of the electrodes 34 is of uniform length in direction of the length dimension of the channel portion 79 and equal to the uniform length of the first electrodes 33. Each of the electrodes 34 have portions which extend over the thick insulating portions of insulating member 30 bordering the thin insulating portion 81. An insulating layer 82 is provided over the electrodes 33 and 34. A plurality of first transfer electrodes 37 is provided over the insulating layer 82. Each of the first transfer electrodes 37 is insulatingly spaced between a respective second electrode 34 and an adjacent succeeding first electrode 33 and overlying these electrodes except in the first stage. The first transfer electrode 37$b$ of the first stage is spaced between the first electrode 33 of the stage and a region 40 of opposite conductivity type in the substrate. One edge of the first transfer electrode 37$b$ insulatingly overlies the first electrode 33. The other edge of the first transfer electrode 37$a$ insulatingly overlies an adjacent long side of the region 40 of opposite conductivity type. The conductivity of the region of opposite conductivity type is enhanced by an elongated metal strip 40$a$ bonded to it. The region 40 of opposite conductivity type is connected over conductive line 69 to region 74 of opposite conductivity type. A plurality of second transfer electrodes 38 is provided over the insulating layer 82, each of the second transfer electrodes 38 is insulatingly spaced between the respective first electrode 33 and an adjacent succeeding second electrode 34 and insulatingly overlying these electrodes. Each of the transfer electrodes 37 and 38 is of substantially uniform extent in the direction of the length of the channel portion 79 and extends over the thin insualting portion 81 of the insulating member 30 as will as bordering thick insulating portions thereof.

All of the electrodes 33 of the second shift register 12 are connected to a line 41 to which a $\phi_D$ voltage is supplied from a fixed voltage source 45. All of the second electrodes of the shift register 12 are connected to line 42 to which a $\phi_C$ voltage is supplied from clocking waveform generator 46. All of the first transfer electrodes 37 and 37$a$ of the shift register are connected to a line 43 to which a $\phi_D'$ voltage is supplied from fixed voltage source 45. All of the second transfer electrodes 38 of the shift register 12 are connected to a line 44 to which a $\phi_C'$ voltage is applied from a clocking waveform generator 46. Each set of four electrodes 38, 34, 37 and 33 serially arranged on a respective thin portion 81 of the insulating member 30 and overlying a respective part of the channel 79 of the shift register form a stage thereof.

The operation of the apparatus of FIGS. 1–3 will now be explained in connection with the waveform diagrams of FIGS. 4A–4D. The first sequence of charge samples or packets are generated by input circuit 22 and are serially applied to the shift register 11. Each packet is clocked from stage to stage over successive clocking cycles until it reaches the last stage. During the first half of a clocking cycle, $t_0$ to $t_1$, a charge packet is transferred into the first storage region underlying electrodes 55 and 56. Over the second half of the clocking cycle, $t_1$ to $t_2$, the packet of charge in the process of transferring through the second transfer region underling the electrodes 65 and 66 is divided into a first part which is stored in the second storage region underlying the second storage electrode 57 and a second part which is stored in the second storage region underlying the second storage electrode 58. Over the first half of the next clocking cycle, $t_2$ to $t_3$, the next packet of charge in the input sequence of samples is clocked into the first storage region underlying the electrodes 55 and 56. Also, the charge stored in the second stored region underlying electrode 57 is transferred through the first transfer region underlying the electrode 62, through region 73 of opposite conductivity type and the conductive connection 67 connecting the region 73 of opposite conductivity type with the region of opposite conductivity type 72, and through the first transfer region underlying the first transfer electrode 61 into the storage region underlying the electrodes 55 and 56 combining with the packet of charge also introduced therein over first half of this cycle. Also, over the first half of the this clocking cycle, the packet of charge stored in the second storage region underlying the electrode 58 is transferred through the first transfer region underlying electrode 63, through region 74 of opposite conductivity type and the conductive connection 69 connecting the region 74 of opposite conductivity type with the region 40 of opposite conductivity type, and through the first transfer region underlying the first transfer electrode 37$b$ into the first storage region underlying adjacent first storage electrode 33. Over the second half of the this cycle, $t_3$ to $t_4$, the combined charge stored in the storage region underlying electrodes 55 and 56, is transferred to the second storage regions underlying electrodes 57 and 58. During the second half of the this clocking cycle, $t_3$ to $t_4$, the charge stored in the storage region underlying electrode 57 is transferred over conductive connection 67 to the first storage region underlying electrodes 55 and 56 and combines with the next packet of charge transferred thereinto from the first shift register. Also, the packet of charge stored under the electrode 58 is transferred to the storage region underlying the first storage electrode 33 of the second shift register. Thus, successive packets of a sequence are processed in the accumulator and clocked out as a second sequence of packets.

If a first sequence consisting of a single packet $Q_n$ were clocked into the first shift register, at the output of the second shift register a second sequence would be obtained in which the initial packet would have the magnitude of $$Q_n \left( \frac{w_2}{w_1 + w_2} \right)$$

corresponding to the second part of the combined charge, where $w_1$ is the width of the second transfer region underlying electrode 65, and $w_2$ is the width of the second transfer region underlying electrode 66. The second output packet would have a magnitude of $$Q_n\left(\frac{w_1}{w_1+w_2}\right)\left(\frac{w_2}{w_1+w_2}\right).$$

The third output packet would have a magnitude of $$Q_n\left(\frac{w_1}{w_1+w_2}\right)^2\left(\frac{w_2}{w_1+w_2}\right)$$

and so on for the succeeding output packets. This sequence of successive values represents the impulse response of the filter. The sequence is an exponential function of the form $e^{-\alpha T}$, where T is the clocking period, and $\alpha$ is the attenutation constant. The attenuation constant $\alpha$ can be readily determined in the following manner. Over a single clock period, the portion charge in the storage region underlying electrodes 55 and 56 which is not transferred to the second storage region underlying electrode 58 is given by the factor of $$\frac{w_1}{w_1+w_2}. \text{ Thus } \frac{w_1}{w_1+w_2} = e^{-\alpha T}, \text{ or}$$

$$\alpha = -\frac{1}{T}\ln\frac{w_1}{w_1+w_2}$$

The output of such a filter in response to a sample data input in the form of a sequence of charge packets is obtained by the convolution of the input sequence with the impulse response of the filter. The frequency response of the filter which is a low pass response is obtained by simply transforming the impulse response into the frequency domain.

The sequence of charge packets is then clocked into second shift register 12 and sensed in output circuit 84 from which an output signal is obtained. An output circuit suitable for providing an output in accordance with the sequence of packets of charge clocked thereinto is described in connection with FIG. 6 of U.S. pat. No. 4,259,598, assigned to the assignee of the present invention and incorporated herein by reference thereto.

To provide high speed operation in charge transfer shift registers, the length of the charge storage regions, i.e., the dimension in the direction of charge transfer into and out of the storage regions is made relatively small in relation to the width thereof. Short length means short charge transfer times and hence high speed. Also, to provide high speed and high equilibration time, metal strips are provided on each of the regions of opposite conductivity type 71, 72, 73 and 74 of the accumulator stage and also on the regions 39 and 40 of opposite conductivity type of the first shift register 11 and the second shift register 12.

The elongated first storage electrode 55 and corresponding elongated first storage region lying thereunder may be eliminated. In this case the first charge transfer region underlying first charge transfer electrode 61 would have one long side thereof contiguous with a long side of the first region 71 of opposite conductivity type. The elongated first storage electrode 55 and the elongated first storage electrode 56 facilitate the formation of the first region of opposite conductivity type.

While the first and second storage electrodes, the first and second transfer electrodes and the regions of opposite conductivity type of the first and second shift registers 11 and 12 and the accumulator 13 have been shown in the embodiment of FIG. 1 as of elongated outline, they may be of other generally rectangular outline, if desired.

In the filter of FIG. 1 both the input signal and the output signal are in the form of a sequence of packets of charge. The output sequenced is obtained by convolving the input sequence with the impulse response of the filter. Such a filter may be readily cascaded with other similarly constituted filters in which an input is applied and an output is obtained in the form of a sequence of charge packets. Such filters are described and claimed in U.S. Pat. Nos. 4,259,596, 4,259,597 and U.S. Pat. No. 4,259,598, assigned to the assignee of the present invention.

While input circuit 22 is provided to convert an input signal into a sequence of charge packets for application to the first shift register, such a circuit is not necessary if the signal is in the form of a sequence of charge packets. In the latter case, the sequence of packets may be directly applied to the first shift register.

While the embodiment of FIG. 1 shows a structure for the splitting of charge packets into two portions by provision of a divider member 53, other such charge splitting structures utilizing several such divider members may be provided to split charge packets into more than two portions, if desired.

While the filter of FIGS. 1-3 utilizes charge transfer devices in which charge storage and transfer occurs in cells adjacent the surface of the semiconductor substrate, the present invention may be implemented with cells of opposite conductivity type regions. Structures of this type commonly referred to as buried channel charge transfer devices, described in U.S. Pat. No. 3,902,187, assigned to the assignee of the present invention and incorporated herein by reference thereto. In such buried channel charge transfer devices, charge storage and transfer occurs in cells below the surface of the semiconductor substrate. Implementation of prior art charge transfer filters with buried channel devices has particular advantages with respect to high speed operation, but suffers from nonlinearities resulting from the variable capacitance between the charge storage cells and their associated overlying electrodes. In the present invention such nonlinearities are not introduced into the output. In connection with a buried channel implementation, of course, surface charge input circuits such as those described above could be used.

While the invention has been described in connection with apparatus constituted of N-type conductivity substrates, P-type conductivity substrates could, as well, be used. Of course, in such a case, the applied potentials and the regions of opposite conductivity type would be reversed in polarity.

While the invention has been described in specific embodiments, it will be understood that modifications, such as those described above, may be made by those skilled in the art, and it is intended by the appended claims to cover all such modifications and changes as fall within the true spirit and scope of the invention.

What is claimed is:

1. In combination,
   a substrate of semiconductor material of one conductivity type,
   means for forming an elongated first charge storage region in said substrate including a first storage electrode of generally elongated outline insulatingly overlying said first storage region, means for forming a pair of elongated second charge storage regions in said substrate including a pair of second storage electrodes of generally elongated outline, each insulatingly overlying a respective one of said second storage regions, a long side of one of said second storage regions spaced a short distance from and parallel to a part of one long side of said first storage region, an elongated first region of opposite conductivity type and high conductivity in aaid substrate having a long side contiguous with the other long side of said first storage region, means forming a pair of elongated first transfer regions in said substrate including a pair of first transfer electrodes each insulatingly overlying a respective one of said first transfer regions, one of said first transfer regions in said substrate having a long side spaced apart a short distance from and parallel to the other long side of said first region of opposite conductivity type, the other of said first transfer regions in said substrate having a long side contiguous with the other long side of said second storage region, an elongated second region of opposite conductivity type and high conductivity in said substrate having a long side contiguous with the other long side of said one first transfer region, an elongated third region of opposite conductivity type and high conductivity in said substrate having a long side contiguous with the other long side of said other first transfer region, means for conductively interconnecting said second region of opposite conductivity type and said third region of opposite conductivity type, said second region of opposite conductivity type, said one of said first transfer regions, said first region of opposite conductivity type, and said first storage region each having long sides of a width equal to a first predetermined value, means for forming a pair of elongated second transfer regions including a pair of second transfer electrodes, one of said second transfer electrodes insulatingly overlying one of said second transfer regions, the other of said second transfer electrodes insulatingly overlying the other of said second transfer regions, one long side of said one second transfer region and one long side of said other second transfer region being coplanar and contiguous, the other long sides of said second transfer regions being noncontiguous said other long side of said one second transfer region being contiguous to said one long side of said one second storage region, said other long side of said other second transfer region being contiguous to said one long side of said other second storage regin, the sum of the width of said one long side of said one second transfer region and the width of said one long side of said other second transfer region being equal to said first predetermined value, means for applying a first fixed voltage to said first storage electrode to form said first storage region in said substrate, means for applying a first pulsating voltage to said second storage electrodes for form said pair of second storage regions in said substrate and to effect the transfer of charge between said first and said second storage regions, means for applying a second fixed voltage to said first transfer electrodes, means for applying a second pulsating voltage to said pair of second transfer electrodes, means for synchronizing said first and said second pulsating voltages, said second fixed voltage being of a value in relation to said first fixed voltage and the levels of said second pulsating voltage to permit transfer of charge in one direction from said first storage region to said second storage regions and the levels of said second pulsating voltage being set in relation to the levels of said first pulsating voltage to permit transfer of charge in said one direction from said first storage region to said second storage regions under the control of the level of the potential on said pair of second transfer electrodes, means for providing a sequence of first quantities of charge, each quantity corresponding to a respective value of a series of successive values of a signal, introducing means including said second region of opposite conductivity type for introducing serially each of said quantities of charge of said sequence into said first charge storage region, whereby over a first half of a cycle of said first pulsating voltage a first fixed portion of charge is transferred to said one second storage region and a second fixed fraction of charge is transferred to said other second storage region, and over a second half of a cycle of said first pulsating voltage said first fixed fraction of charge is transferred to said first charge storage region and combines with a successive quantity of charge introduced into said first charge storage region by said introducing means, removing means including said other of said second transfer regions for removing periodically said second fixed fraction of charge in said other second charge storage region to provide a sequence of second quantities of charge, said second fixed fraction of charge periodically removed from said second charge storage region by said removal means being determined by the ratio of the width of said one long side of said other second transfer region to the sum of the width of the one long side of said one second transfer region and the width of said one long side of said other second transfer region, means for forming a second elongated first charge storage region in said substrate including said first storage electrode of generally elongated outline insulatingly overlying said first storage region, in which a long side of said second elongated first charge storage region is contiguous with the other long side of said first region of opposite conductivity type, and in which the other long side of said second elongated first charge storage region is contiguous with said one long side of said one first transfer region.

2. The combination of claim 1 in which said removing means includes a third elongated first transfer region having a third first transfer electrode lying over said third elongated first transfer region and connected to said pair of first transfer electrodes, said third elongated first transfer region having a long side contiguous with the other long side of said other second storage region, an elongated region of opposite conductivity type having a long side contiguous with the other long side of said third second transfer region.

3. The combination of claim 1 in which a plurality of metallic members are provided each contiguous with a respective one of said regions of opposite conductivity type along the width thereof.

4. The combination of claim 1 in which a plurality of metallic members are provided each contiguous with a respective one of said regions of opposite conductivity type along the width thereof.

5. In combination,
a substrate of semiconductor material of one conductivity type,
means for forming first charge storage region of generally rectangular outline in said substrate including a first storage electrode of generally rectangular outline insulatingly overlying said first storage region,
means for forming a pair of second charge storage regions each of generally rectangular outline in said substrate including a pair of second storage electrodes of generally rectangular outline, each insulatingly overlying a respective one of said second storage regions,
a long said of one of said second storage regions spaced a short distance from and parallel to a part of a long side of said first storage region,
a first high conductivity region of opposite conductivity type and of generally rectangular outline in said substrate having a long side contiguous with a long side of said first storage region,
means forming an first transfer region of generally rectangular outline in said substrate including a first transfer electrode overlying said first transfer region,
said first transfer region in said substrate having a long side spaced apart a short distance from and parallel to the other long side of said first region of opposite conductivity type,
a second high conductivity region of opposite conductivity type and of generally rectangular outline in said substrate having a long side contiguous with the other long side of said one first transfer region,
means for forming a pair of elongated second transfer regions of generally rectangular outline including a pair of second transfer electrodes,
one of said second transfer electrodes insulatingly overlying one of said second transfer regions,
the other of said second transfer electrodes insulatingly overlying the other of said second transfer regions,
one long side of said one second transfer region and one long side of said other second transfer region being coplanar and contiguous, the other long sides of said second transfer regions being noncontiguous,
said other long side of said one second transfer region being contiguous to said one long side of said one second storage region, said other long side of said other second transfer region being contiguous to a long side of said other second storage region,
means for applying a first fixed voltage to said first storage electrode to form said first storage region in said substrate,
means for applying a first pulsating voltage to said second storage electrodes to form said pair of second storage regions in said substrate and to effect the transfer of charge between said first and said second storage regions,
means for applying a second fixed voltage to said first transfer electrodes,
means for applying a second pulsating voltage to said pair of second transfer electrodes, means for synchronizing said first and second pulsating voltages, said second fixed voltage being of a value in relation to said first fixed voltage and the levels of said second pulsating voltage to permit transfer of charge in one direction from said first storage region to said second storage regions, sand the levels of said second pulsating voltage being set in relation to the levels of said first pulsating voltage to permit transfer of charge in said one direction from said first storage region to said second storage regions under the control of the level of the potential on said pair of second transfer electrodes,
means for providing a sequence of first quantities of charge, each quantity corresponding to a respective value of a series of successive values of a signal,
introducing means including said first transfer region for introducing serially each of said quantities of charge of said sequence into said first charge storage region, whereby over a first half of a cycle of said first pulsating voltage a first fixed portion of charge is transferred to said one second storage region and a second fixed fraction of charge is transferred to said other second storage region,
said first fixed fraction being proportional to the ration of the width of said one long side of said one transfer region to the sum of the widths of said one long side of said one second transfer region and the width of said one long side of said other second transfer region,
means for forming a second first charge storage region of generally rectangular outline in said substrate including a second first storage electrode of generally rectangular outline insulatingly overlying said second first storage region of generally rectangular outline, in which
a long side of said second first charge storage region is contiguous with the other long side of said first region of opposite conductivity type, and in which the other long side of said second first charge storage region is contiguous with said one long side of said one first transfer region.

6. The combination of claim 5 in which a second high conductivity region of opposite conductivity type and of generally rectangular outline is provided in said substrate having a long side contiguous with the other long side of said one first transfer region and in which said introducing means includes said second region of opposite conductivity type.

7. The combination of claim 6 in which a plurality of metallic members are provided each contiguous with a respective one of said regions of opposite conductivity type along the width thereof.

8. The combination of claim 5 in which a metallic member is provided contiguous with said region of opposite conductivity type along the width thereof.

9. The combination of claim 5 in which a plurality of metallic members are provided each contiguous with a respective one of said regions of opposite conductivity type along the width thereof.

* * * * *